United States Patent
Ebert et al.

(10) Patent No.: US 7,030,984 B2
(45) Date of Patent: Apr. 18, 2006

(54) FAST WAFER POSITIONING METHOD FOR OPTICAL METROLOGY

(75) Inventors: Martin Ebert, Fremont, CA (US); Ilya Chizhov, Oakland, CA (US)

(73) Assignee: Therma-Wave, Inc., Fremont, CA (US)

( * ) Notice: Subject to any disclaimer, the term of this patent is extended or adjusted under 35 U.S.C. 154(b) by 335 days.

(21) Appl. No.: 10/424,263

(22) Filed: Apr. 28, 2003

(65) Prior Publication Data

US 2004/0027572 A1 Feb. 12, 2004

Related U.S. Application Data

(60) Provisional application No. 60/382,667, filed on May 23, 2002.

(51) Int. Cl.
*G01B 11/00* (2006.01)
(52) U.S. Cl. .................... 356/400; 356/620
(58) Field of Classification Search .......... 356/400, 356/401, 614, 620
See application file for complete search history.

(56) References Cited

U.S. PATENT DOCUMENTS

| | | | | |
|---|---|---|---|---|
| 4,708,466 A | * | 11/1987 | Isohata et al. | 355/53 |
| 5,499,099 A | * | 3/1996 | Sato et al. | 364/400 |
| 6,038,029 A | * | 3/2000 | Finarov | 356/399 |
| 6,546,125 B1 | * | 4/2003 | Su | 382/144 |
| 6,608,920 B1 | * | 8/2003 | Su et al. | 356/237.4 |
| 6,661,517 B1 | * | 12/2003 | Marini | 356/401 |
| 6,714,302 B1 | * | 3/2004 | Suzuki et al. | 356/401 |
| 6,791,686 B1 | * | 9/2004 | Finarov | 356/399 |
| 6,886,153 B1 | * | 4/2005 | Bevis | 716/19 |
| 2003/0142313 A1 | * | 7/2003 | Katayama | 356/399 |

* cited by examiner

*Primary Examiner*—Michael P. Stafira
*Assistant Examiner*—Juan D Valentin, II
(74) *Attorney, Agent, or Firm*—Stallman & Pollock LLP

(57) ABSTRACT

A fast wafer positioning method for optical metrology includes three main steps. In the first step, an initial measurement recipe is constructed for the host system and target wafer. In the next step, the host system performs a test run using the initial measurement and the target wafer. In this step, the initial measurement recipe is refined to eliminate positioning errors produced by the host system. In the final step, the refined measurement recipe is used by the host system to process production wafers (e.g., as part of a production environment). This is performed using the information included in the refined measurement recipe without reference to optical images of the wafers being processed.

10 Claims, 1 Drawing Sheet

FAST WAFER POSITIONING METHOD FOR OPTICAL METROLOGY

PRIORITY CLAIM

The present application claims priority to U.S. Provisional Patent Application Ser. No. 60/382,667, filed May 23, 2002, the disclosure of which is incorporated herein by reference.

TECHNICAL FIELD

The subject invention relates generally to optical methods for inspecting and analyzing semiconductor wafers and other samples. In particular, the subject invention relates to methods for rapidly transporting and accurately positioning wafers within optical metrology tools.

BACKGROUND OF THE INVENTION

As geometries continue to shrink, manufacturers have increasingly turned to optical techniques to perform nondestructive inspection and analysis of semiconductor wafers. Techniques of this type, known generally as optical metrology, operate by focusing an optical beam on a sample and then analyzing the reflected energy. Ellipsometry and reflectometry are two examples of commonly used optical techniques. For the specific case of ellipsometry, changes in the polarization state of the optical beam are analyzed. Reflectometry is similar, except that changes in magnitude of the reflected intensities are analyzed. Scatterometry is a related technique that is used when the structural geometry of a subject creates diffraction (optical scattering) of the incoming probe beam. Scatterometry systems analyze diffraction to deduce details of the structures that cause the diffraction to occur.

Techniques of this type may be used to analyze a wide range of attributes. This includes film properties such as thickness, crystallinity, composition and refractive index. Typically, measurements of this type are made using reflectometry or ellipsometry as described more fully in U.S. Pat. No. 5,910,842 and 5,798,837 both of which are incorporated in this document by reference. Critical dimensions (CD) including line spacing, line width, wall depth, and wall profiles are another type of attributes that may be analyzed. Measurements of this type may be obtained using monochromatic scatterometry as described in U.S. Pat. Nos. 4,710,642 and 5;164,790 (McNeil). Another approach is to use broadband light to perform multiple wavelength spectroscopic reflectometry measurements. Examples of this approach are found in U.S. Pat. No. 5,607,800 (Ziger); U.S. Pat. No. 5,867,276 (McNeil) and U.S. Pat. No. 5,963,329 (Conrad) (each of the patents is incorporated in this document by reference). Still other tools utilize spectroscopic ellipsometric measurement. Examples of such tools can be found in U.S. Pat. No. 5,739,909 (Blayo) and U.S. Pat. No. 6,483,580 (Xu). Each of these patents and publications are incorporated herein by reference.

Photo-modulated reflectance (PMR) is another technique used to perform nondestructive inspection and analysis of semi-conductor wafers. As described in U.S. Pat. No. 4,679,949 (incorporated in this document by reference), PMR-type systems use a combination of two separate optical beams. The first of these, referred to as the pump beam is created by switching a laser on and off. The pump beam is projected against the surface of a subject causing localized heating of the subject. As the pump laser is switched, the localized heating (and subsequent cooling) creates a train of thermal waves in the subject. The second optical beam, referred to as the probe beam is directed at a portion of the subject that is illuminated by the pump laser. The thermal waves within the subject alter the reflectivity of the subject and, in turn, the intensity of the reflected probe beam. A detector synchronously samples the reflected probe beam synchronously with the switching frequency of the pump laser. The resulting output is used to evaluate parameters such as film thickness and material composition.

In wafer fabrication environments, optical metrology systems inspect wafers at various stages during the production cycle. To avoid contaminating the wafers, these systems typically include electromechanical wafer handling systems. The handling system includes a robot arm for transferring wafers from a cassette into the measurement region. Various motion stage combinations are used to move wafers with respect to the measurement or probe beam. For example, stages with X and Y linear travel coupled with a theta stage for rotating the wafer are common. Other combinations include polar coordinate stage systems that rotate the wafer and move the wafer along only a single linear axis.

Optical metrology systems typically follow a measurement recipe where the wafer is successively positioned so that very specific sites are selectively aligned with the probe beam. As the feature size on the semiconductor wafers continue to shrink, very accurate positioning of the wafer is necessary to insure proper measurement. Unfortunately, the stage motion systems typically do not have the precision to permit accurate positioning merely by instructing the stage where to move. Rather, in a typical operation, instructions are given for a particular set of stage movements to bring the probe beam near the measurement site. At this point, the lens of an imaging system is moved into position and an image of the wafer is recorded. Pattern recognition software is used to determine the current wafer location and whether a corrective move is necessary. The imaging lens is then removed and the optics for focusing the probe beam are moved in position. The selected measurement can then be made. Typically, this process is divided into two stages. In the first stage, a measurement recipe is created using the following steps:

1) Using the wafer imaging system and wafer positioning controls, the operator identifies each measurement site on the wafer.
2) For each measurement site, the operator uses a computer graphical user interface and imaging system to identify a vision model. The vision model is a portion of the wafer image that will be used to identify the associated measurement site.
3) The displacement from the measurement site to the vision model is recorded.
4) The identity of the die within the wafer that includes the measurement site is recorded.

In the second stage, the measurement recipe is used as part of the production process.

To use the measurement recipe, the following steps are used:

1) The metrology tool positions the wafer by selecting the die and the expected position of the measurement site within the die. At that location, the metrology tool acquires an image of the wafer.
2) The metrology tool searches for the vision model associated with this measurement site in the acquired image.
3) If the metrology tool finds the vision model, it calculates an offset between the location of the vision model and the expected location of he vision model (i.e., the position in which the vision model was located during the development of the measurement recipe).

4) The metrology tool uses the offset along with the displacement from the vision model to the measurement site to determine the actual location of the measurement site.

5) The metrology tool performs a corrective move and positions the wafer for measurement.

6) The tool performs the measurement.

In practice, the process of searching and identifying the vision model is often time consuming. It may also require positioning of the mechanical parts of the measurement system (such as lenses, etc.) to enable the acquisition of the image by the wafer imaging system. As a result, the use of imaging tends to have an undesirable impact on the rate at which the metrology tool performs the measurement process.

One approach to dealing with this problem is to very accurately characterize the movement of the stage in advance. This can be done by issuing a series of movement commands to the stage system. At each location, the actual positions of the stage and the expected positions (stage error) are compared and stored. Over time, a complete correction map of the stage performance can be generated. Thereafter, during measurements, when a move command is to be generated, the map can be consulted and suitable offsets added to the command so that the wafer will be moved to the correct position. Measurement without a prior visual inspection of location can be considered "blind positioning."

While the above approach could produce the desired result, in practice it is difficult to implement. This follows because it is generally necessary to complete a very large number of test movements of differing lengths and differing directions to construct an adequate map. The large number of movements means that construction of complete stage maps can be very time consuming. Complete maps also fail to compensate for wear induced changes in stage movement. As a result, complete maps become increasingly inaccurate over time.

Based on the preceding, it is clear that there is a need for better methods for positioning wafers in optical metrology systems. This is particularly true for production environments where wafer throughput must constantly be increased.

SUMMARY OF THE INVENTION

The present invention provides a fast wafer positioning method for optical metrology. For this method, a measurement recipe is generated for an optical metrology tool. The measurement recipe is then used by the optical metrology tool to quickly locate measurement sites within semiconductor wafers. To create the measurement recipe, a series of measurement sites are identified within the subject wafer. The optical metrology tool then performs a test run where the wafer is positioned at each measurement site in turn. At each site, an offset between the actual and optimal location of the measurement site is calculated. This offset of each measurement site is stored along with the original location of the each measurement site to create the measurement recipe. In subsequent measurements of similar wafers, the recipe is used to guide the optical metrology tool without the use of imaging.

DETAILED DESCRIPTION OF THE PREFERRED EMBODIMENTS

Figure 1:
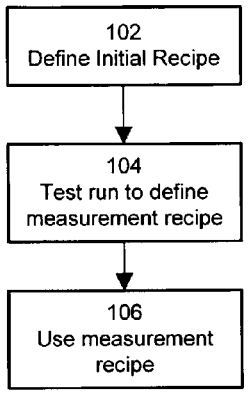
FIG. 1 is a flowchart showing the steps associated with the fast wafer positioning method provided by the present invention.

The present invention provides a fast wafer positioning method for optical metrology. The end result of this method is the production of a measurement recipe that allows an optical metrology system (the host system) to rapidly process a particular type of semiconductor wafers (the target wafer). As shown in overview in FIG. 1, the method for fast wafer position includes three main steps. In the first step, an initial measurement recipe is constructed for the host system and target wafer (see step 102). In the next step, the host system performs a test run using the initial measurement and the target wafer (see step 104). In this step, the initial measurement recipe is refined to eliminate positioning errors produced by the host system. In the final step, the refined measurement recipe is used by the host system to process wafers (e.g., as part of a production environment) (see step 106). This is performed using the information included in the refined measurement recipe without reference to optical images of the wafers being processed. The following sections describe each of these steps in more detail.

To construct the initial recipe (i.e., to implement step 102) an operator uses the wafer imaging system and wafer positioning controls of the host system to identify a series of measurement sites on the target wafer. At each measurement site, the operator uses the imaging system to identify a vision model. The vision model is a portion of the wafer image that will be used to identify the associated measurement site. The coordinates of the vision model, along the coordinates of the measurement site are recorded in the initial map. In practice, semiconductor wafers are nearly always subdivided into a series of separate die. As a result, the coordinates of the measurement site and the vision model are stored as offsets into the die in which they are included. The location of the including die is also stored in the initial recipe.

Figure 2:
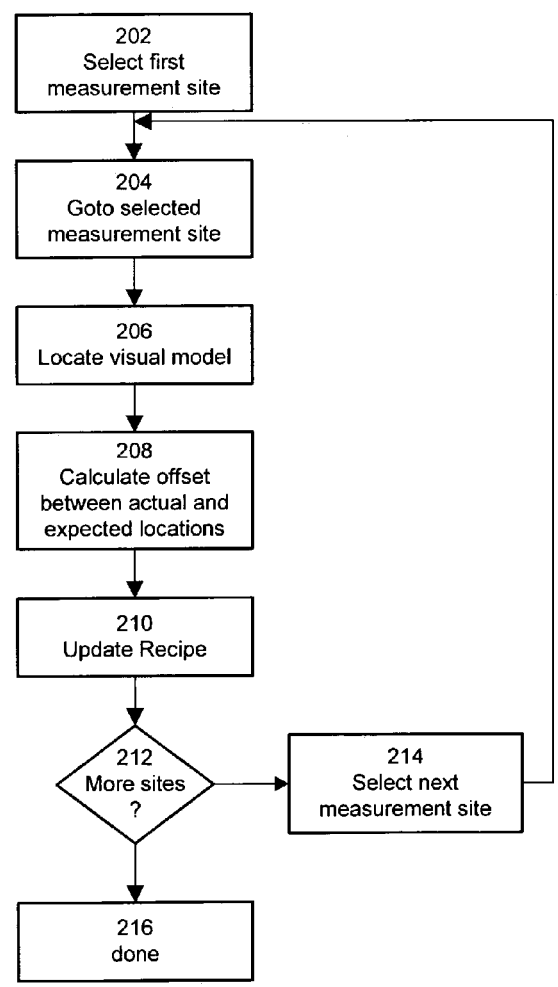
FIG. 2 is a flowchart showing the steps associated with refinement of an initial recipe to generate a measurement recipe.

Once the initial recipe has been completed, it is refined during a test run of the host system. As shown in FIG. 2, the test run will typically start with the selection of one of the measurement sites included in the initial recipe (see step 202). The operator causes the host system to position the target wafer for measurement of the selected measurement site (see step 204). With the wafer in that position, the operator uses the imaging system of the host system to locate the vision model associated with the selected measurement site (see step 206). If the host system were perfectly accurate, the position of the vision model would be identical to the location in which it was found during construction of the initial model. In practice, subtle errors are introduced when the target wafer is positioned for measurement. In step 208, the resulting difference between the location of the vision model and its expected position is calculated. This difference is used (in step 210) to update the initial recipe. Typically, this is done by adding an adjustment value to the initial recipe where the adjustment value is associated with the selected measurement site. In other cases, it is possible update the initial recipe by changing the stored locations of the selected measurement site and its associated vision model.

Steps 212 determines if there are additional measurement sites that have yet to be updated by the steps just described. If there are, step 214 selects one of these measurement sites and the loop continues. In the alternative (i.e., where all measurement sites have been updated) the test run procedure ends at step 216. When that step is reached, the measurement recipe is ready for use by the host system.

In subsequent use (step 106 of FIG. 1), the host system accesses measurement sites within production wafers using the coordinates and adjustments included in the measurement recipe. This process is typically performed "blind" without the use of optical imaging. This reduces delays and increases throughput of the measurement process. Unlike other blind approaches, this is accomplished without the use of a complete wafer map. This avoids the time and expense involved in building maps of this type. The ability to rapidly construct measurement recipes allows the measurement recipe to be quickly updated as mechanical wear causes the characteristics of the host system to change over time. In a similar fashion, the measurement recipe may be quickly updated to account for batch-to-batch differences in production wafers.

Although the subject method has been described with respect to movable stages, the approach could also be useful in systems that have movable optics. Such a system is described in PCT publication WO00/57127, published Sep. 28, 2000 and incorporated herein by reference. In the latter system, the measurement spot is illuminated either by movement of the optical system alone or through a combination of movements of the stage and the optical system.

What is claimed is:

1. A method for fast wafer positioning in an optical metrology system, the method comprising:
   identifying a series of measurement sites within a first wafer;
   in conjunction with an imaging system, moving the first wafer through a series of positions where each position places a respective measurement site in alignment with the optical metrology system for inspection;
   calculating the difference between the actual position of each measurement site and the expected position of the measurement site when the measurement site has been aligned at an optimal position for inspection; and
   using the calculated differences to instruct the optical metrology system to position a second wafer for measurement at the measurement sites without using the imaging system.

2. A method as recited in claim 1 that further comprises:
   identifying a respective visual model for each measurement site; and
   measuring the location of each visual model as its respective measurement site is aligned for measurement.

3. A method as recited in claim 1, wherein the wafer is moved by repositioning a mechanically movable stage.

4. A method of optical inspecting wafers with a metrology tool, said metrology tool including a stage for supporting the wafer and an optical system for illuminating a region of interest on the wafer and a motion system for changing the position of the optical system with respect to the wafer, said method comprising the steps of:
   a) creating a measurement recipe which defines a plurality of locations of interest on a wafer for measurement;
   b) issuing instructions to the motion system to align the optical system with a first location of interest on a first wafer;
   c) capturing an image of the wafer and determining any position error between the actual position of the optical system and the desired position;
   d) repeating steps (b) and (c) for each of the locations of interest in the recipe; and
   e) executing the measurement recipe on a second wafer, wherein instructions are issued to the motion system to sequentially align the optical system with each of the locations of interest without imaging the wafer and wherein said instructions include information about position errors determined in step (c).

5. A method as recited in claim 4, wherein the motion system includes a mechanically movable stage.

6. A method as recited in claim 4, wherein the motion system operates to translate the optics with the respect to the stage.

7. A method of optically semiconductor wafers comprising the steps of:
   identifying a set of locations on a wafer where an optical measurement is to be made;
   sequentially positioning, with the aid of an imaging system, a test wafer into alignment with an optical measurement system at each of said locations;
   for each location, determining an offset between the expected location and the actual location found using the imaging system;
   sequentially positioning a product wafer into alignment with the measurement system at each of said locations using the determined offsets associated with each position and without the aid of the imaging system; and
   obtaining a measurement at each location with the optical measurement system.

8. A method as recited in claim 7, wherein the set of locations forms a part of a measurement recipe.

9. A method as recited in claim 7, wherein said positioning steps are performed by moving a stage supporting the wafer with respect to the optical measurement system.

10. A method as recited in claim 7, wherein said positioning steps are performed by translating the optics of the optical measurement system with respect to the wafer.

* * * * *